(12) United States Patent
Philipp et al.

(10) Patent No.: US 8,397,220 B1
(45) Date of Patent: Mar. 12, 2013

(54) SIMULATION CONTROL TECHNIQUES

(75) Inventors: Thomas Philipp, Aachen (DE); Dietmar Petras, Langerwehe (DE); Tom Michiels, Leuven (DE)

(73) Assignee: Synopsys, Inc., Mountain View, CA (US)

( * ) Notice: Subject to any disclaimer, the term of this patent is extended or adjusted under 35 U.S.C. 154(b) by 1201 days.

(21) Appl. No.: 12/030,192

(22) Filed: Feb. 12, 2008

Related U.S. Application Data

(60) Provisional application No. 60/889,523, filed on Feb. 12, 2007.

(51) Int. Cl.
*G06F 9/44* (2006.01)

(52) U.S. Cl. ......... 717/135; 717/124; 717/126; 717/129

(58) Field of Classification Search .................. None
See application file for complete search history.

(56) References Cited

U.S. PATENT DOCUMENTS

| | | | |
|---|---|---|---|
| 4,819,234 A * | 4/1989 | Huber ........................... 717/129 |
| 5,146,460 A * | 9/1992 | Ackerman et al. .............. 714/33 |
| 5,493,672 A | 2/1996 | Lau et al. |
| 5,732,247 A | 3/1998 | Dearth et al. |
| 5,805,867 A | 9/1998 | Kodaira |
| 5,937,179 A | 8/1999 | Swoboda |
| 6,014,512 A | 1/2000 | Mohamed et al. |
| 6,026,230 A * | 2/2000 | Lin et al. ........................... 703/13 |
| 6,230,114 B1 * | 5/2001 | Hellestrand et al. ............ 703/13 |
| 6,378,124 B1 | 4/2002 | Bates et al. |
| 6,389,379 B1 * | 5/2002 | Lin et al. ........................ 703/14 |
| 6,543,049 B1 | 4/2003 | Bates et al. |
| 6,681,384 B1 | 1/2004 | Bates et al. |
| 6,708,326 B1 | 3/2004 | Bhattacarya |
| 6,718,294 B1 | 4/2004 | Bortfeld |
| 6,751,583 B1 * | 6/2004 | Clarke et al. .................... 703/17 |
| 6,823,518 B1 | 11/2004 | Bliss et al. |
| 6,862,694 B1 | 3/2005 | Tormey et al. |
| 6,892,324 B1 * | 5/2005 | French et al. .............. 714/38.14 |
| 7,124,404 B1 | 10/2006 | Bebout et al. |
| 7,331,002 B2 | 2/2008 | Rivard et al. |
| 7,480,825 B2 * | 1/2009 | Vorbach ..................... 714/38.14 |
| 7,742,905 B2 | 6/2010 | Vanspauwen et al. |
| 7,849,450 B1 * | 12/2010 | Rydh et al. ..................... 717/131 |
| 7,984,304 B1 * | 7/2011 | Waldspurger et al. ........ 713/187 |
| 2002/0032559 A1 * | 3/2002 | Hellestrand et al. ............ 703/22 |
| 2002/0100024 A1 | 7/2002 | Hunter et al. |
| 2002/0133325 A1 | 9/2002 | Hoare, II et al. |
| 2002/0162051 A1 * | 10/2002 | Bolding et al. ................. 714/34 |
| 2002/0199173 A1 | 12/2002 | Bowen |
| 2003/0037317 A1 * | 2/2003 | Emberson ..................... 717/129 |

(Continued)

FOREIGN PATENT DOCUMENTS

JP 06075820 3/1994

OTHER PUBLICATIONS

Title: A cost model for selecting checkpoint positions in time warp parallel simulation, author: glia, F dated: 2001.*

(Continued)

*Primary Examiner* — Chameli Das
(74) *Attorney, Agent, or Firm* — Fenwick & West LLP

(57) ABSTRACT

Simulation control techniques include shutting down peer processes and user code modules, storing an image of a simulation as a checkpoint after the peer processes and user code modules are shutdown, and re-starting user code modules and peer processes after storing an image of the simulation. The resulting checkpoint and processes can be used for restoring from a checkpoint or restarting a new simulation environments having peer processes such as debuggers coupled to the simulation.

16 Claims, 6 Drawing Sheets

U.S. PATENT DOCUMENTS

| | | | |
|---|---|---|---|
| 2003/0074177 A1* | 4/2003 | Bowen | 703/22 |
| 2004/0250244 A1* | 12/2004 | Albrecht | 717/135 |
| 2005/0010880 A1* | 1/2005 | Schubert et al. | 716/4 |
| 2005/0144585 A1 | 6/2005 | Daw et al. | |
| 2005/0229163 A1 | 10/2005 | Bates et al. | |
| 2005/0283674 A1 | 12/2005 | Rivard et al. | |
| 2005/0289396 A1 | 12/2005 | Hooper et al. | |
| 2006/0195822 A1* | 8/2006 | Beardslee et al. | 717/124 |
| 2006/0195825 A1* | 8/2006 | Vanspauwen et al. | 717/135 |
| 2006/0206873 A1* | 9/2006 | Argade | 717/135 |
| 2009/0132991 A1 | 5/2009 | Ganai et al. | |
| 2010/0251217 A1* | 9/2010 | Miller | 717/126 |
| 2011/0307233 A1* | 12/2011 | Tseng et al. | 703/14 |

OTHER PUBLICATIONS

Title: Introduction to modeling and simulation, Author: Carson, J.S., II dated: Dec. 5, 2004.*

Bedicheck, Robert. "Talisman: Fast and Accurate Multicomputer Simulation" ACM 1995, pp. 14-24.

* cited by examiner

SIMULATION CONTROL TECHNIQUES

CROSS-REFERENCE TO RELATED APPLICATIONS

This application claims the benefit of U.S. Provisional Patent Application No. 60/889,523 filed Feb. 12, 2007, which is incorporated herein by reference.

BACKGROUND OF THE INVENTION

A checkpoint is a collection of data on a computing device-readable medium, such as a hard disk drive, which contains an image of a running process on a computing system for the time when the checkpoint was created. By restoring a checkpoint the process is restarted and set into the state at the time that the checkpoint was created. The behavior of the process that was restored from a checkpoint is equivalent to the original process just after creating the checkpoint.

There are checkpoint and restore solutions for interpretive languages, such as Verilog and VHDL. For example, the hardware simulation environments of Cadence and Mentor Graphics support checkpoint/restore of simulation for the Verilog and VHDL interpretive languages. However, there are currently only limited checkpoint & restore solutions available for compiled languages (e.g., C/C++ programs, SystemC, etc.). For example, GNU Emacs create a checkpoint during its build procedure to shorten the setup time of the GNU Emacs. When GNU Emacs is started it is actually restored from that checkpoint. The checkpoint, however, does not contain the state of the stack of the process. In addition, GNU Emacs checkpoint/restore procedure does not support multi-threading or inter-process connectivity.

Other compiled language checkpoint/restore libraries do not support restoring connectivity to debuggers or other external applications. The compiled language solutions also do not fully support operating-system dependent resources like multi-threading, mutexes, shared memory and/or the like.

SUMMARY OF THE INVENTION

Embodiments of the present technology are directed toward techniques for checkpointing, restoring and restarting simulations with peer (e.g., debugger) connectivity. In one embodiment, the start of checkpointing includes notifying the peer processes on start of the checkpointing. The inter-process communication channels are closed in response to the start of checkpoint notice. After closing inter-process communication channels, the peers notify the simulation control process that they are ready for checkpointing. In addition, the user code modules are notified on start of checkpointing. In response, operating system dependent resources are shut down by the user code modules in response to the start of checkpoint notice. The user code modules then notify the simulation control process that they are ready for checkpointing, after shutting down operating system dependent resources. The connection between the simulation control process and the simulation is then closed. The state of the simulation is then saved to a checkpoint directory on a computing device readable medium.

After storing an image of the simulation, the connection between the simulation control process and the simulation is restored. Thereafter, user code modules are notified of the end of checkpointing. The operating system dependent resources are then restored by the user code modules. Thereafter, the simulation control process is notified that the user code modules are ready. Similarly, the peer processes are notified of the end of checkpointing. The inter-process communication channels are restored by the peer processes in response to the end of checkpoint notice. Thereafter, the peer processes notifying the simulation control process that they are ready after restoring the inter-process communication channels. The simulation is then continued.

In another embodiment, a simulation is started in response to a restore event. The environment and arguments are restored to the ones of the simulation process when the checkpoint was created. The new simulation is suspended before initialization of global constructs and each peer processes receives an end of the restoring notice. Each user code module is notified of the restore. The operating system dependent resources are restored by the user code modules in response to the end of restoring notice. Thereafter, the simulation control process is notified that the one or more user code modules are ready. The inter-process communication channels are also restored by the peer processes in response to the end of restore notice. Thereafter, the simulation control process is notified that the peer processes are ready. After the user code modules and peer processes are ready, the simulation is continued from the checkpoint.

In yet another embodiment, a simulation is started in response to a simulation restart event. The new simulation is suspended before initialization of global constructs. Each peer process is notified on restart of the simulation. Inter-process communication channels are re-established by the peer processes in response to the restart notice. After re-establishing the inter-process communication channels, the peer processes notify the simulation control process that they are ready. Thereafter, the simulation is continued.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Embodiments of the present technology are directed toward techniques that enable the creation of checkpoints and the restoring from such checkpoints for SystemC simulation processes. The techniques provide for the connectivity of other processes, like debuggers, visualization applications, and/or the like external applications during the creation of checkpoints and the restoring from checkpoints. Thus, when a SystemC simulation is restored from a checkpoint, the connectivity of the external applications are also restored. The debuggers are also enabled to save information on control instances, like breakpoints and watchpoints, into the checkpoint and to restore such control structures when the simulation is restored.

Figure 1:
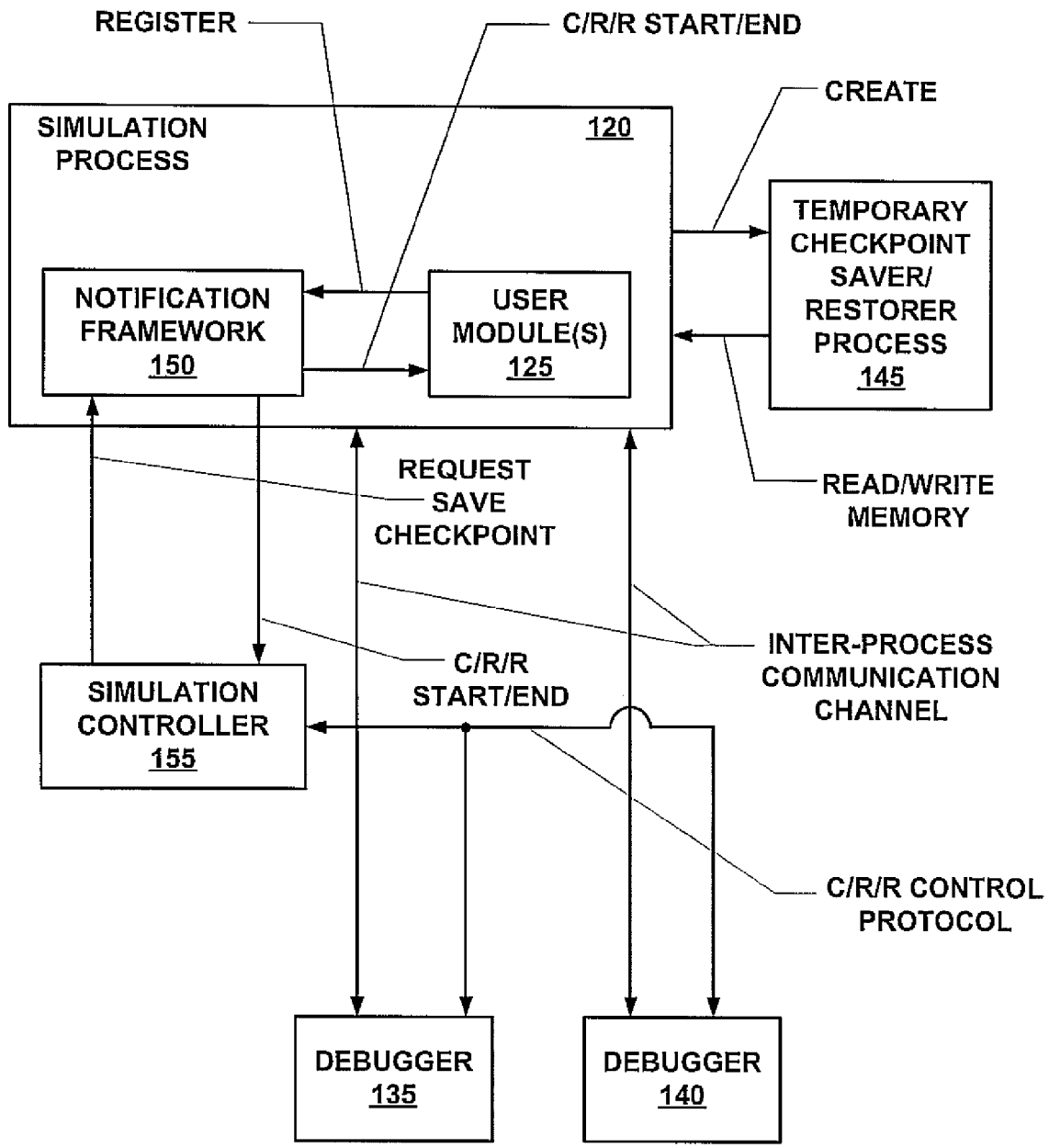
FIG. 1 shows a block diagram of a simulation architecture, in accordance with one embodiment of the present technology.

Referring to FIG. 1, a simulation architecture, in accordance with one embodiment of the present technology, is shown. The simulation architecture includes a simulation process 120, one or more user code modules 125, one or more peer processes 135, 140, a temporary checkpoint saver/restorer process 145 a notification framework 150 and a simulation controller 155. The simulation controller 155 controls the procedures for creating checkpoints, restoring from checkpoints and restarting simulations. During checkpoint, restore and restart procedures the simulation controller 155 creates the temporary checkpoint saver/restorer process 145 that executes some parts of the checkpoint, restore and restart procedures that require reading and writing to the memory of the simulation from outside the simulation process 120.

Peer processes 135, 140 associated with the simulation process 120 register with the simulation controller 155. The notification framework 150, inside the simulation process 120, provides for the registration of user code modules 125. SystemC modules and other user code modules 125 register with the notification framework 150 to get notifications about the start and end of checkpoints, and restore and restart events. The notification framework 150 also provides for un-registration of user modules 125 from notification events. The notification framework 150 provides notifications to all registered user modules 125 on the start of checkpoint events, on the end of checkpoint event and end of restore events. Similarly, the simulation controller 155 provides for the registration with the notification framework 150 of peers 135, 140 to notification events. The simulation controller 155 also provides for un-registration of peers 135, 140 from the notification events. The simulation controller 155 also provides a list of available checkpoints, provides for peer requests for creation of checkpoints, peer requests to delete checkpoints, peer requests for renaming checkpoints and peer requests for restoring checkpoints.

The peers 135, 140 register with the simulation controller 155. The peers 135, 140 provide a class name and may optionally define an image that may be used during restore to start a new process of the peer. In one implementation, all peers of a certain class register with the same image. If peers of the same class register with different image, or one peer registers with an image and another of the same class registers without an image, then the first given image may be used for all peers of the given class.

During a restore procedure the collection of peers 135, 140 will usually differ from that during creation of a checkpoint. Therefore, the restore procedure executes a mapping mechanism of available peers to the original role of peers during checkpointing. The original peers, as used herein, are the peers that have been connected to the simulation controller 155 during creation of a checkpoint. A given peer may be assigned a different instance identifier during each checkpoint procedure. Therefore, each peer is characterized by its peer class and an instance identifier. The instance identifier is valid during a given checkpointing procedure. It is assigned by a "beginning of checkpointing" notification routine. Active peers are the peers that are registered with the simulation controller 155 when a restore procedure is initiated.

During checkpointing the simulation controller 155 assigns identifiers to the peers. Peers of the same class may be numbered by ascending number starting with zero. Peers may use the class name and the instance identifier for saving their own checkpoint data into the checkpoint directory. For example, a peer having peer class="RVD" and id=1 may save its data to a file such as Checkpoints/MyCheckpoint/RVD.1.

Figure 2A:
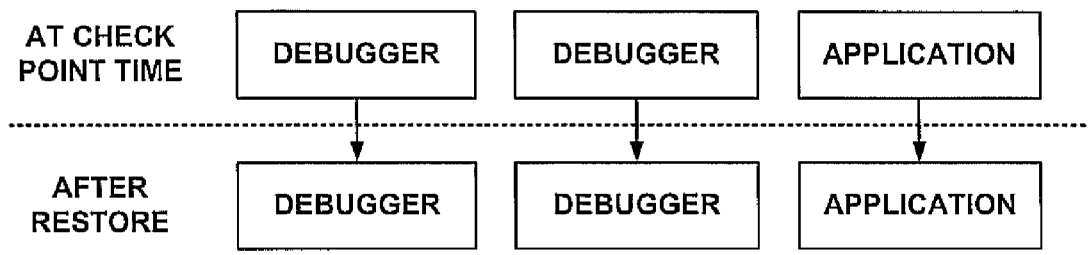
FIGS. 2A-2E show a block diagram of registration of client, in accordance with embodiments of the present technology.

During restoring from a checkpoint, the simulation controller 155 again assigns identifiers to the peers. Peers of the same class may again be identified by ascending numbers starting with zero. The peers then read checkpoint data from the file created by the corresponding class instance during checkpointing. As shown in FIG. 2A, the case where the same or the same type of debuggers are registered to the simulation controller 155 during creation of a checkpoint and a restore of the checkpoint is illustrated. In such case, there is a one-to-one mapping of the peers.

Figure 2B:
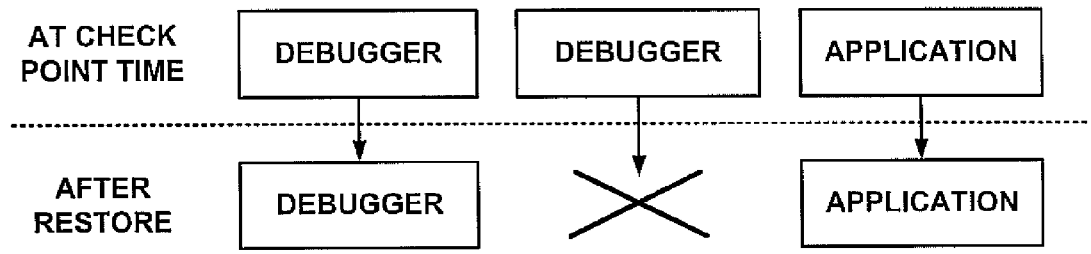

If there are less active peers of a certain class registered during restoring a checkpoint than during creation of checkpoint, and if the peer class is associated with an image (specified during the registration of the peer before checkpointing) the simulation controller 155 automatically tries to start the number of missing peers. For example, the simulation controller 155 sets the environment variable CWR_RESTORE_SIMCONTROL_SIOR to it's SIOR to inform the newly started client about how to register to the servicing simulation controller instance. The case where there are fewer peers during restore then at checkpoint time is illustrated in FIG. 2B. As shown, the missing peer cannot be started since the original peer did not specify an image. The debugger in the example may have been closed before restore, the debugger may not have had an executable image or the like, and therefore the debugger is not restarted.

Figure 2C:
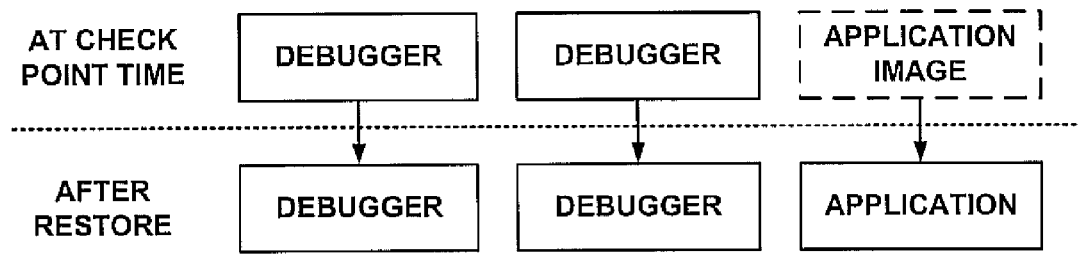

If there are more active peers of a certain class registered than during creation of the checkpoint, they are notified about the end of restore with an identifier, such as −1, indicating that they shall not be reconnected to the simulation. The case where there are more peers during restore then at checkpoint time is illustrated in FIG. 2C. In such case, the missing peer can be restarted because the original peer specified an executable image. The application in the example may have closed before restore but registered an executable image. Therefore, the image is executed to replace the missing application.

Figure 2D:
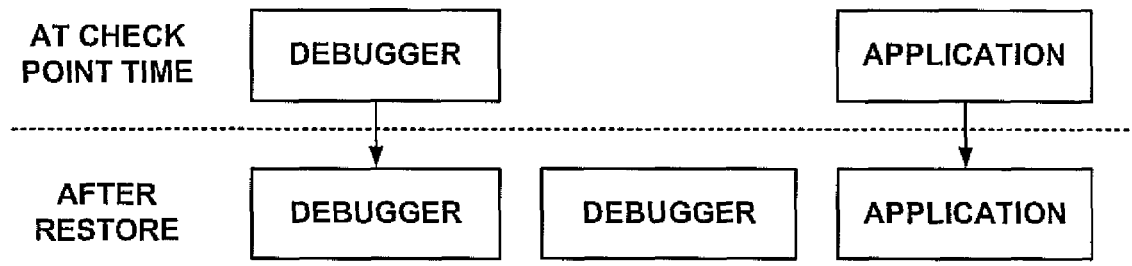
Figure 2E:
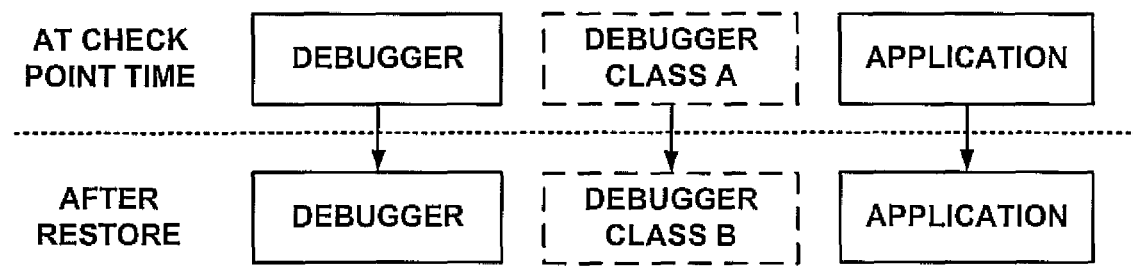

FIG. 2D illustrates a case where there are more peers during restore then at checkpointing time. The additional peer does not re-attach to the simulation but keeps being a peer of the simulation controller 155. The debugger in the example was not active at checkpointing time. It is therefore informed that is has no counterpart in the simulation. FIG. 2E illustrates a case where there are peers with class mismatch. In such case, the class of a peer during restore does not match to the classes of peers at checkpoint time. As a result, only peers of the same class are re-attached to the simulation. The debugger in the example at the time of checkpointing was attached to the simulation in a first class. During restore, the debugger of a second class is not reattached to the simulation. Instead, the debugger is informed that it has no counterpart in the simulation.

The simulation environments provides for saving checkpoints, restoring from check points and restarting with a new simulation. Saving a checkpoint includes a start checkpoint process and an end checkpoint process. The start checkpoint process begins with the simulation controller 155 suspending the simulation 120. The simulation controller 155 notifies peers 135, 140 about start of checkpointing. The peers 135, 140 are notified to disconnect from the simulation 120. The peers 135, 140 close their respective inter-process communication channels to the simulation 120. A parameter in the notification identifies the memory area where checkpoint data is to be saved. After the peer processes 135, 140 close their inter-process communication channels, the peer processes 135, 140 signal to the simulation controller 155 that they are ready for checkpointing. The simulation controller 155 may also notify registered peers that the simulation 120 temporarily does not support checkpointing and when the simulation again supports checkpointing. The simulation controller 155 expects a "ready for checkpointing" notification from all registered peers 135, 140 All registered user modules 125 are then notified about the start of checkpointing by the simulation controller 155 via the notification framework 150. If the simulation includes user code 125, the user code is responsible for shutting down all operating system dependent resources used by the user code modules. In particular, all files and sockets are closed, all semaphores, mutexes, and condition variables are released, certain DLLs are detached, all threads except for the main thread are closed and the like. Thereafter, the user code modules 125 notify the simulation controller 155 via the notification framework 150 that they are ready for checkpointing. In addition, a user code modules 125 may notify the simulation controller 155 it temporarily does not support checkpointing and when it supports checkpointing again. The simulation controller 155 expects a "ready for checkpointing" notification from user modules 125. Thereafter, the simulation controller 155 triggers checkpointing inside the simulation and disconnects from the simulation The simulation process 120 starts the temporary checkpoint saver/restorer process 145 and suspends itself. The checkpoint saver/restorer process 145 saves the state of the simulation 120 to a checkpoint area (e.g., file and/or directory) on a computing device readable medium (CDRM), such as a hard disk drive. The state of the simulation saved to the CDRM includes the stack, heap, global variable, DLL data, environment, and thread context. The peers are also enabled to save information on control instances like breakpoints or watchpoints into the checkpoint and to restore such control structure when the simulation is restored from the checkpoint.

The checkpoint saver/restorer process 145 resumes the simulation process 120 and terminates itself during the end checkpoint process. All operating system dependent resources are re-established. Connection between the simulation 120 and the simulation controller 155 is re-established. All registered user modules 125 are notified about the end of checkpointing by the notification framework 150. The user modules open sockets and other operating system dependent resources used by the user code modules. After all registered user module 125 signal to the notification framework 150 that they are ready after checkpointing the notification framework 150 sends a "checkpoint procedure finished" notification to the simulation controller 155. In turn, the simulation controller 155 notifies registered peers 135, 140 about the end of checkpointing. The peers 135, 140 re-establish inter-processes communication channels with the simulation 120 and notify the simulation controller 155 that they have re-established all connection and are ready after checkpointing. The simulation controller 155 expects "ready after checkpointing" notification from all registered peers 135, 140. Thereafter the simulation 120 continues.

The processes performed by the simulation controller 155 may be realized by a remote C/R control protocol. The implementation of the protocol can be based on any inter-process communication platform, such as pipes, TCP, RCP, CORBA or the like. The protocol is operated by the simulation controller 155 so that the communication channel with the peers 135, 140 is not interrupted by the checkpoint, restore or restart procedures.

The "restore checkpoint" procedure is controlled by the simulation controller 155. If a simulation is running when the restore process starts, it is shutdown. Before the initialization of the global constructors a hook drives the simulation into the restore procedure. There can be any number of peers 135, 140 that are registered with the simulation controller 155, as during the normal operation of a simulation. A new simulation process is started when the "restore checkpoint" procedure starts. A simulation attribute indicates the simulation that shall be restored from a specific checkpoint. A parameter also identifies the memory area (e.g., HDD) where checkpoint data can be read. The environment and arguments are restored to the ones of the simulation process when the checkpoint was created. The simulation is in a state where all operating system dependent resources are comparable to the state during checkpointing. In particular, only the main thread is running and all DLLs that have been loaded during checkpointing are loaded. The simulation process 120 starts the temporary checkpoint saver/restorer process 145 and suspends itself. The checkpoint saver/restorer process 145 restores the state of the simulation from the checkpoint information on the CDRM. In particular, memory locations are allocated, process memory including the stack, head, global variable, DLL data and environment are restored and the thread context is recovered. The checkpoint restorer process 145 resumes the simulation process 120 and terminates itself. All operating system dependent resources are re-established to the state before checkpointing. All registered user modules 125 are notified about end of restoring. After receiving the end of restoring notification from the notification framework 150, the user modules 125 notify the notification framework 150 that they are ready after restoring. Connection between the simulation 120 and the simulation controller 155 is re-established. The simulate controller 155 is also notified about end of restoring and in turn the simulation controller 155 notifies peers 135, 140 about the end of restoring. The peers re-establish inter-process communication channels to the restored simulation 120. After all peer processes 135, 140 signal "ready after restoring" to the simulation controller 155, the simulation controller 155 signals ready after restoring to the simulation 120. In response thereto, the restored simulation 120 continues.

In addition to restoring from a checkpoint, the simulation controller 155 allows restarting a simulation. The "restarting simulation" procedure is a modification of the "restore checkpoint" procedure. It is controlled by the simulation controller 155. If a simulation, referred to as the current simulation, is running when the restart procedure starts, it is closed. There can be any number of peers 135, 140 registered with the simulation controller 155, as during the normal operation of a simulation. A new simulation is started when the "restarting simulation" process starts. A parameter identifies the new simulation process. The simulation image, environment and arguments may be reused from the last start of a simulation. The new simulation suspends immediately after start. The connection between the new simulation process 120 and the simulation controller 155 is established. The simulation controller 155 notifies the peers 135, 140 about restart of simulation. The peers 135, 140 re-establish inter-process communication channels to the re-started simulation. Thereafter, the peers 135, 140 notify the simulation controller 155 that they have re-established all connection to the new simulation 120 and are ready after restart. After all peer processes 135, 140 signal to the simulation controller 155 that they are ready after restarting, the simulation controller 155 continues the new simulation. Furthermore, it is to be noted that the new simulation process may still be halted by any of the attached debuggers.

If the simulation includes GNU GDB debuggers, the GDB communicates with the simulation by the GDB remote serial protocol over TCP/IP. This enables usage of the GDB in its original state without any modification to its source code. For that reason the GDB does not understand the C/R control protocol and cannot register to the C/R control process 155. Therefore, the connections between the simulation 120 and GNU GDB debuggers are handled in a specific way.

Figure 3A:
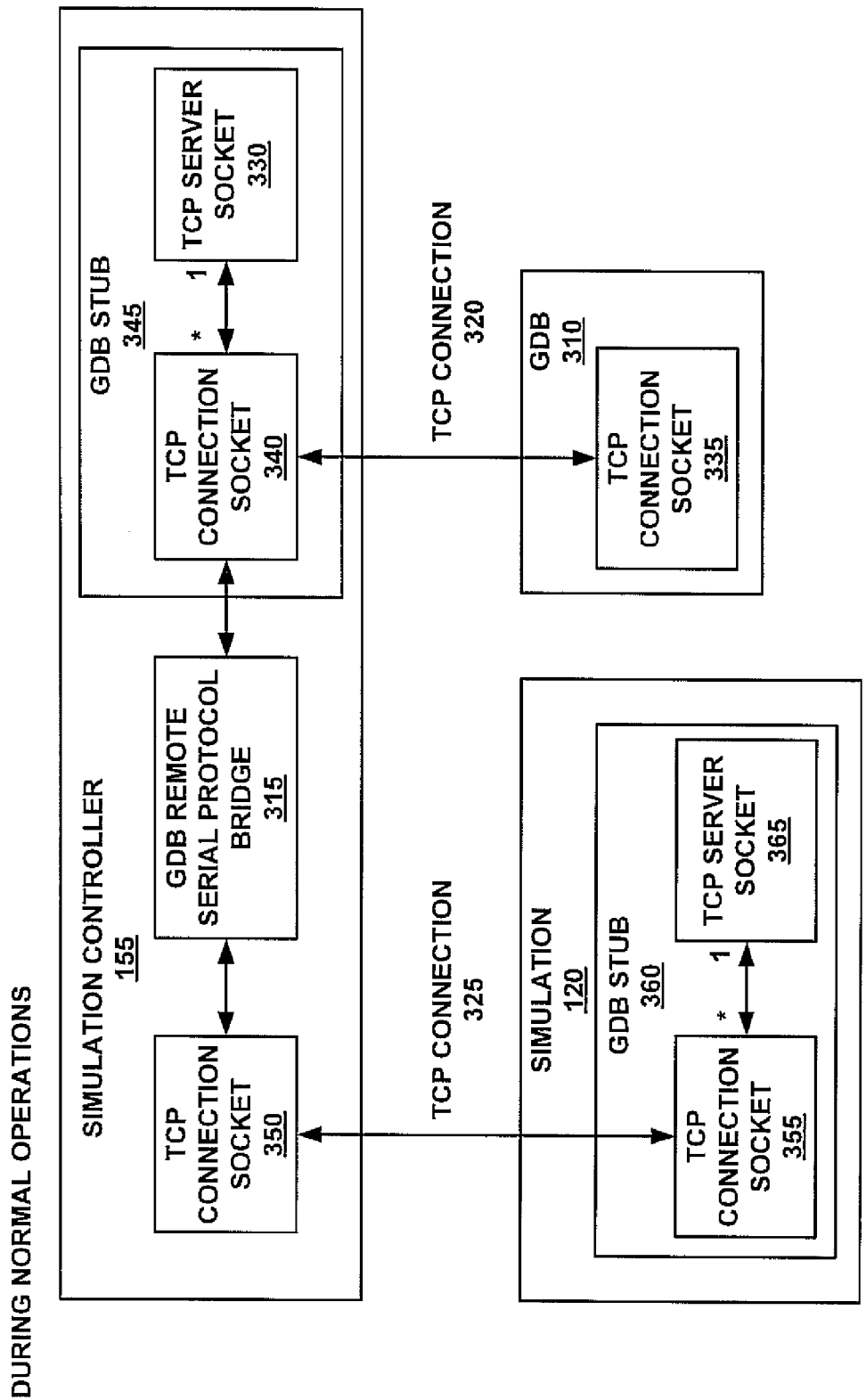
FIGS. 3A-3C show a block diagram of a process of handling GDB connection during checkpointing and restoring, in accordance with one embodiment of the present technology.
Figure 3B:
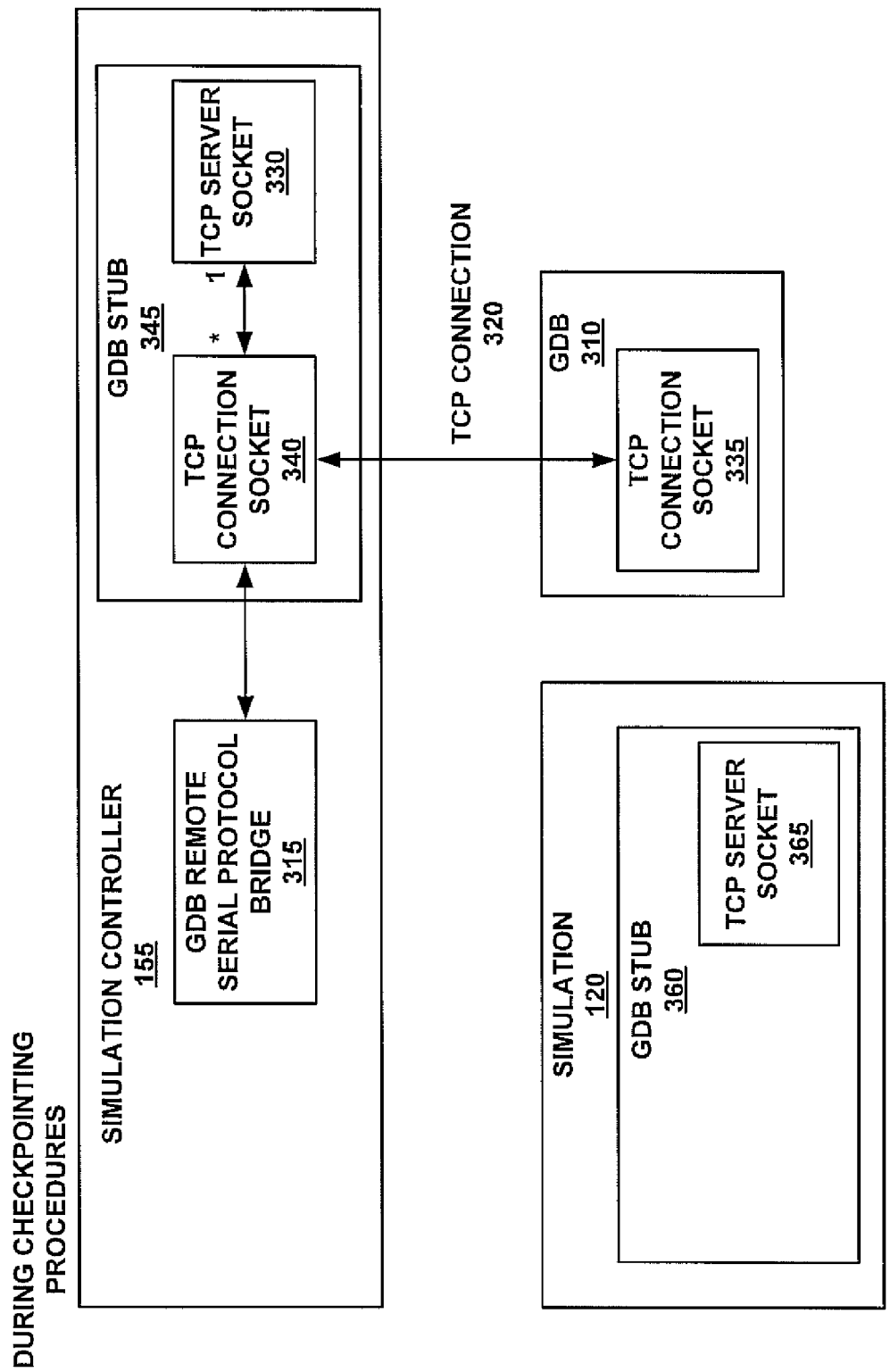
Figure 3C:
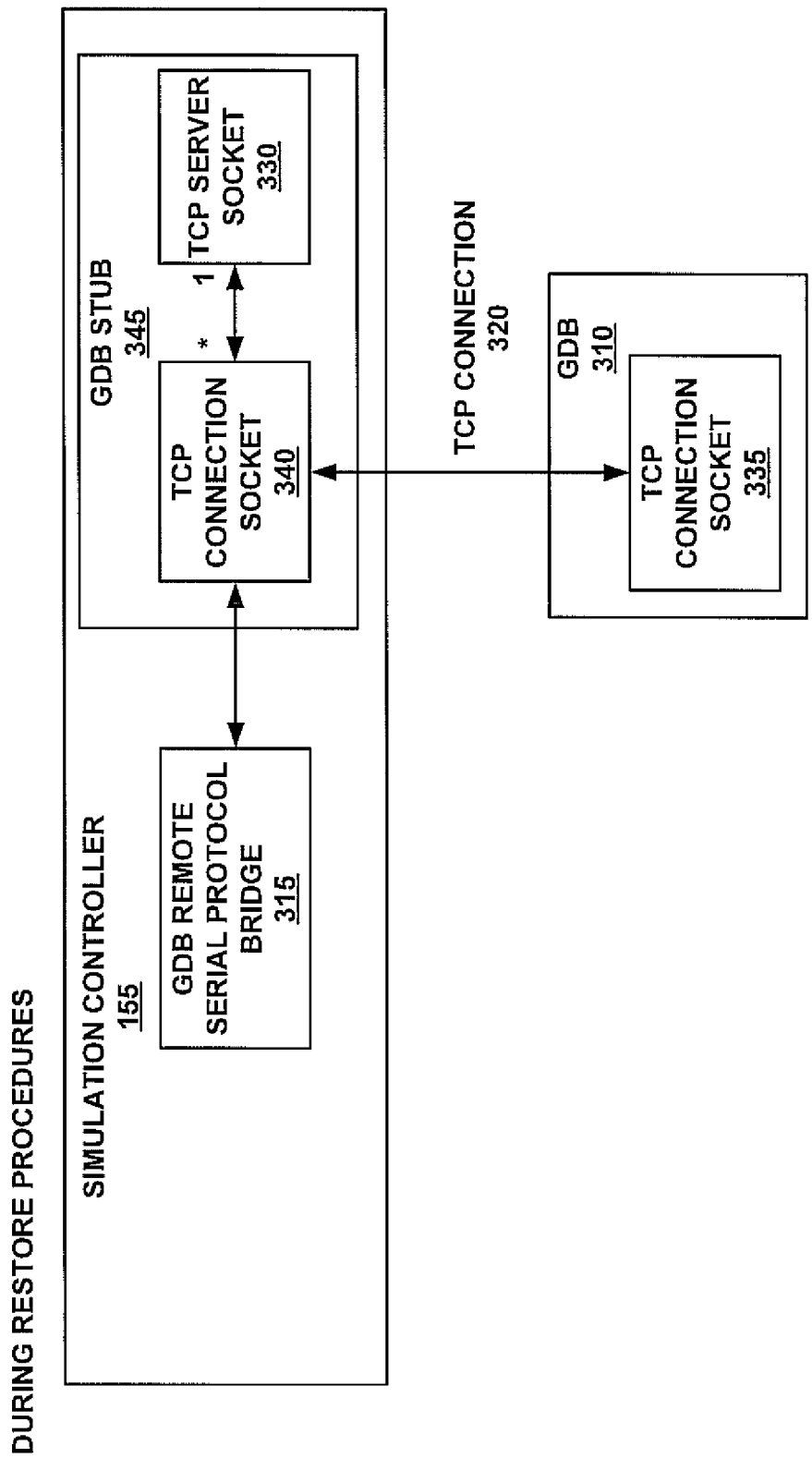

Referring now to FIGS. 3A-3C, the process of handling GDB connections during checkpointing and restoring, in accordance with one embodiment of the present technology, is shown. Generally, a GDB 310 is coupled to a simulation 120 through a GDB remote serical protocol bridge 315 in the simulation controller 155 using TCP connections 320, 325. When the GDB contacts a listening socket, TCP server socket 330, to open a TCP connection, a new TCP socket 335, 340 and a first instance of a GDB stub 345 is created. The simulation controller 155 is a mirror of the TCP sockets in the simulation 120. Thus, when a GDB 310 connects to a socket 335, 340, the simulation controller creates a TCP socket 350, 355 that connects a second instance of the GDB stub 360 for the simulation 120. The GDB remote serial protocol bride 315 transparently forwards the remote serial protocol driven by the GDB 310. An instance of the GDB remote serial protocol bridge 315 is created per such TCP connection 320, 325.

There is always a TCP server socket 330, 365 even if no GDB is connected. The GDB stub 345, 360 is the owner of its respective TCP connection 320, 325 and the TCP connection sockets 335, 340, 350, 355 are the end points of the respective TCP connections 320, 325. There may be multiple such TCP server sockets 330, 365 in a simulation providing GDBs different gates to connect to the simulation 120. Furthermore, if multiple GDBs are attached to the simulation controller 155 in order to be forwarded to the simulation, there is one instance of the GDB remote serial protocol bridge 340 per attached GDB 320.

During checkpointing, restoring or restarting, the simulation controller 155 is detached from the GDB stub 360 in the simulation 120, as depicted in FIG. 3B. First, while the simulation controller 155 is preparing for checkpointing it closes the TCP connection 325. The simulation controller then requests checkpointing and the notification framework notifies all user modules to shutdown OS resources. As a consequence the TCP server socket 350, 355 is shutdown. The simulation controller 155 terminates the GDB remote serial protocol by answering, delaying and/or aborting commands issued by the GDB 310 in such a way that the GDB 310 does not close the TCP connection 320 and detach from the simulation controller 155, as illustrated in FIG. 3C.

The embodiments of the present technology advantageously provide full support for multithreading, usage of operating system dependent resources or inter-process communication channels as required for checkpointing, restoring and restarting of SystemC simulations with debugger connectivity. The checkpointing techniques include closing connections to peer processes, shutting down operating system resources in user code modules, storing an image of a simulation as checkpoint after the user code modules and peer processes have been prepared for checkpointing, and re-establishing the state of user code modules and peer processes after storing an image of the simulation. The resulting checkpoint can be used for restoring from a checkpoint or restarting a new simulation.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. One or more non-transitory computing device readable medium which store one or more computing device executable instructions which when executed by one or more computing devices perform a method comprising:
    shutting down a plurality of peer processes coupled to a simulation process and each of one or more user code modules of the simulation process, wherein at least one of the peer processes or user code modules are registered with the simulation process before a checkpoint, and wherein the registration of each peer process and user code module includes a class of the respective peer process or user code module and an instance identifier;
    storing an image of the simulation process as the checkpoint after the plurality of peer processes and one or more user code modules are shutdown;
    storing information on control instance of each of the peer process into the checkpoint using the class and instance identifier of the peer process; and
    restoring the simulation from the checkpoint, including re-starting user code modules and peer processes, wherein the one or more peer processes available before the checkpoint are mapped to one or more peer processes active during restoring the simulation based upon the class and the instance identifier of each registered peer process.

2. The method according to claim 1, wherein shutting down peer processes and user code modules comprises:
    notifying each of one or more peer processes, by the simulation controller, on start of the checkpointing;
    closing inter-process communication channels, by the one or more peer processes, in response to the start of checkpoint notice;
    notifying the simulation control process that the one or more peers processes are ready for checkpointing after closing inter-process communication channels;
    notifying each of one or more user code modules, by a simulation controller, on start of the checkpointing;
    shutting down operating system dependent resources, by the one or more user code modules, in response to the start of checkpoint notice;
    notifying the simulation control process that the one or more user code modules are ready for checkpointing after shutting down operating system dependent resources; and
    closing a connection between the simulation control process and the simulation after receiving ready for checkpointing notifications from the one or more user code modules and the one or more peer processes.

3. The method according to claim 2, wherein re-starting user code modules and peer processes comprises:
- restoring a connection between a simulation control process and the simulation after storing an image of the simulation;
- notifying each of the user code modules on end of the checkpointing;
- restoring the operating system dependent resources, by the user code modules, in response to the end of checkpoint notice;
- notifying the simulation control process that the user code modules are ready after restoring the operating system dependent resources;
- notifying, each of the peer processes on end of the checkpointing;
- restoring the inter-process communication channels, by the peer processes, in response to the end of checkpoint notice;
- notifying, the simulation control process that the peer processes are ready after restoring the inter-process communication channels; and
- continuing the simulation.

4. The method according to claim 2, wherein the simulation controller comprises a notification framework and a Checkpoint control process.

5. The method according to claim 1, wherein storing an image of the simulation comprises saving a state of the simulation to a checkpoint directory on a computing device readable medium.

6. The method according to claim 5, wherein the state of the simulation comprises one or more of a stack, a heap, a global variable, a dynamic link library (DLL), an environment, and a thread context.

7. The method according to claim 5, wherein the one or more peer processes save control instance information including a breakpoint or watchpoint to the checkpoint directory.

8. The method according to claim 1, wherein the one or more peers includes a GNU debugger (GDB), and a bridge in the simulation control process bridges the GNU debugger (GDB) to a GDB stub in file simulation.

9. The method according to claim 8, wherein there is a separate instance of the GDB stub for each GNU debugger (GDB) coupled to the simulation.

10. The method according to claim 8, wherein the simulation control process terminates communications from the GNU debugger (GDB) by answering, delaying or aborting commands issued by the GNU debugger (GDB) so that the GNU debugger (GDB) does not close its connection to the bridge.

11. A One or more non-transitory computing device readable medium which store one or more computing device executable instructions which when executed by one or more computing devices perform a method comprising:
- starting a simulation;
- suspending the simulation before initialization of global constructs, wherein at least one peer process and at least one user code module are registered with the simulation, and wherein the registration of each peer process and user code module includes a class of the respective peer process or user code module and an instance identifier of the respective peer process or user code module;
- notifying each of one or more user code modules on end of the restoring;
- restoring the one or more user code modules from a checkpoint, in response to the end of restoring notice, including restoring operating system dependent resources;
- notifying the simulation control process that the one or more user code modules are ready after restoring the operating system dependent resources;
- notifying each of one or more peer processes on end of the restoring;
- restoring the one or more peer processes from a checkpoint, in response to the end of restore notice, including restoring inter process communication channels, wherein one or more peer processes available before the checkpoint are mapped to one or more peer processes active during restoring the simulation based upon the class and the instance identifier of each registered peer process;
- notifying a simulation control process that the one or more peer processes are ready after restoring the inter process communication channels; and
- continuing the simulation upon restoring the one or more user code modules and one or more peer process of the simulation from the checkpoint.

12. The method according to claim 11, wherein the simulation is started with a state from checkpoint information stored on a computing device readable medium.

13. The method according to claim 12, wherein the state comprises one or more of a stack, a heap, a global variable, a dynamic link library (DLL), an environment, and a thread context.

14. The method according to claim 11, wherein the one or more peer processes read checkpointing data from a checkpointing directory created by a corresponding class instance during checkpointing.

15. The method according to claim 11, further comprising defining an image to be used during restore to start a new process of a peer process.

16. The method according to claim 11, wherein peer processes of a given class register with the same image.

* * * * *

UNITED STATES PATENT AND TRADEMARK OFFICE
CERTIFICATE OF CORRECTION

PATENT NO. : 8,397,220 B1
APPLICATION NO. : 12/030192
DATED : March 12, 2013
INVENTOR(S) : Thomas Philipp, Dietmar Petras and Tom Michiels It is certified that error appears in the above-identified patent and that said Letters Patent is hereby corrected as shown below:

Title page, item (75), replace "Tom Michiels, Leuven (DE)" with --Tom Michiels, Leuven (BE)--.

Signed and Sealed this
Twenty-seventh Day of August, 2013

Teresa Stanek Rea
*Acting Director of the United States Patent and Trademark Office*